(12) United States Patent
Ishikura

(10) Patent No.: US 9,166,009 B2
(45) Date of Patent: Oct. 20, 2015

(54) SEMICONDUCTOR APPARATUS AND METHOD FOR MAKING SEMICONDUCTOR APPARATUS

(75) Inventor: Kohji Ishikura, Kanagawa (JP)

(73) Assignee: RENESAS ELECTRONICS CORPORATION, Kanagawa (JP)

( * ) Notice: Subject to any disclaimer, the term of this patent is extended or adjusted under 35 U.S.C. 154(b) by 29 days.

(21) Appl. No.: 14/112,374

(22) PCT Filed: Apr. 6, 2012

(86) PCT No.: PCT/JP2012/002417
§ 371 (c)(1),
(2), (4) Date: Oct. 17, 2013

(87) PCT Pub. No.: WO2012/147287
PCT Pub. Date: Nov. 1, 2012

(65) Prior Publication Data
US 2014/0034971 A1 Feb. 6, 2014

(30) Foreign Application Priority Data
Apr. 25, 2011 (JP) ................................. 2011-096929

(51) Int. Cl.
*H01L 29/417* (2006.01)
*H01L 29/32* (2006.01)
(Continued)

(52) U.S. Cl.
CPC ............ *H01L 29/32* (2013.01); *H01L 29/2003* (2013.01); *H01L 29/41725* (2013.01);
(Continued)

(58) Field of Classification Search
CPC ..................... H01L 29/2003; H01L 29/41725; H01L 29/41758; H01L 29/4175; H01L 29/41775

USPC ............................ 356/237.4, 237.5; 257/773
See application file for complete search history.

(56) References Cited

U.S. PATENT DOCUMENTS 4,206,469 A * 6/1980 Hanes et al. ................... 257/341
5,343,071 A * 8/1994 Kazior et al. ................. 257/621
(Continued)

FOREIGN PATENT DOCUMENTS

JP 62-252949 11/1987
JP 5-190574 7/1993
(Continued)

OTHER PUBLICATIONS

Nanbu et al., Classification of Surface Defects on GaAs Grown by Molecular Beam Epitaxy, J. Electrochem. Soc., 1986, vol. 133, No. 3, pp. 601-604. doi: 10.1149/1.2108627.*
(Continued)

*Primary Examiner* — Fernando L Toledo
*Assistant Examiner* — Christine C Lau
(74) *Attorney, Agent, or Firm* — Young & Thompson

(57) ABSTRACT

A semiconductor apparatus invention includes a substrate (1), an epitaxial layer (2) formed on the substrate (1), a gate electrode (3), a source electrode (4), and a drain electrode (5) that are formed on the epitaxial layer. The source electrode (4) and the drain electrode (5) each include at least two first divided electrodes that are formed to extend in parallel to each other in a first direction, inter-electrode distances Ps and Pd between the first divided electrodes are greater than or equal to a radius of an abnormal growth portion formed on a surface of the epitaxial layer (2), and widths of the first divided electrodes are less than or equal to the radius of the abnormal growth portion.

20 Claims, 10 Drawing Sheets

(51) Int. Cl.
*H01L 29/20* (2006.01)
*H01L 29/423* (2006.01)
*H01L 29/66* (2006.01)
*H01L 29/778* (2006.01)
*H01L 29/812* (2006.01)
*H01L 29/78* (2006.01)

(52) U.S. Cl.
CPC .... *H01L29/41758* (2013.01); *H01L 29/41775* (2013.01); *H01L 29/42316* (2013.01); *H01L 29/66446* (2013.01); *H01L 29/66462* (2013.01); *H01L 29/7787* (2013.01); *H01L 29/78* (2013.01); *H01L 29/812* (2013.01)

(56) References Cited

U.S. PATENT DOCUMENTS

| | | | |
|---|---|---|---|
| 7,265,399 | B2 | 9/2007 | Sriram et al. |
| 7,903,707 | B2 | 3/2011 | Kamikawa et al. |
| 8,304,812 | B2 * | 11/2012 | Onishi et al. .......... 257/194 |
| 8,410,558 | B2 * | 4/2013 | Inoue .................... 257/409 |
| 2004/0164407 | A1 * | 8/2004 | Nakajima et al. ...... 257/724 |
| 2006/0091480 | A1 * | 5/2006 | Desko et al. .......... 257/401 |
| 2006/0091498 | A1 | 5/2006 | Sriram et al. |
| 2007/0051961 | A1 | 3/2007 | Kamikawa et al. |
| 2008/0176366 | A1 | 7/2008 | Mita et al. |
| 2010/0150199 | A1 | 6/2010 | Kamikawa et al. |
| 2010/0252863 | A1 * | 10/2010 | Kawasaki ............... 257/192 |
| 2014/0103434 | A1 * | 4/2014 | Lu .......................... 257/346 |

FOREIGN PATENT DOCUMENTS

| | | |
|---|---|---|
| JP | 2004-356454 | 12/2004 |
| JP | 2008-124262 | 5/2008 |
| JP | 2008-518462 | 5/2008 |

OTHER PUBLICATIONS

Martinez-Criado et al., Study of Defects in GaN:Mg by Hard X-Ray Nanoprobe, Appl. Phys. Lett, 95, 151909 (2009).*
Chen et al., Measurement of Threading Dislocation Densities in GaN by Wet Chemical Etching Semicond. Sci. Technol., 21, No. 9 (Sep. 2006) 1229-1235. doi: 10.1088/0268-1242/21/9/004.*
International Search Report, PCT/JP2012/002417, Jun. 26, 2012.
Y. Inou et al., Degradation-Mode Analysis for Highly Reliabel GaN-HEMT, MTT-S 2007, Digest pp. 639.
F. Yamaki et al., "Leakage Current Screening for AlGaN/GaN HEMT Mass-Production", CS MANTECH Conference 2007, Digest pp. 95.

* cited by examiner (Comparative Example)

(Comparative Example)

SEMICONDUCTOR APPARATUS AND METHOD FOR MAKING SEMICONDUCTOR APPARATUS

TECHNICAL FIELD

The present invention relates to a semiconductor apparatus and a method for making the semiconductor apparatus, and especially to a semiconductor apparatus and a method for making the semiconductor apparatus that are capable of easily removing, by an appearance check, a semiconductor apparatus including an abnormal growth portion in an operating region.

BACKGROUND ART

As one of high-speed Field effect transistors (FETs) with excellent breakdown tolerance, there is a field effect transistor using a gallium nitride (GaN) based semiconductor material having wide-bandgap characteristics. The field-effect transistor using GaN is used for, for example, a high-frequency amplifier, a high power amplifier, and a power switching device. However, it is difficult to fabricate a GaN substrate for epitaxial growth of such a structure, thus in many cases, GaN is epitaxially grown on an SiC substrate, sapphire substrate, and an Si substrate, for example. At this time, an abnormal growth portion may be generated on the surface of a GaN epitaxial film depending on a substrate used for growing GaN and growth conditions.

Possible causes of forming an abnormal growth portion 103 are a defect (micropipe) in an SiC substrate 101 where a GaN film 102 is grown and abnormal growth around a minute dust adhered during the growth. The abnormal growth portion could be formed on a GaN film that is epitaxially grown on an Si substrate and a sapphire substrate and on an SiC film that is epitaxially grown on an SiC substrate.

Patent Literature 1 discloses a technique relating to a high power transistor that is capable of reducing drain-to-source capacitance by dividing a drain electrode into two. Moreover, Patent Literature 2 discloses a technique in which drain electrodes and source electrodes are formed in lattice to reduce parasitic capacitance in the drain electrodes and the source electrodes.

CITATION LIST

Patent Literature

Patent Literature 1: Published Japanese Translation of PCT International Publication for Patent Application, No. 2008-518462
Patent Literature 2: Japanese Unexamined Patent Application Publication No. H5-190574

Non Patent Literature

Non Patent Literature 1: Y. Inoue, S. Masuda, M. Kanamura, T. Ohki, K. Makiyama, N. Okamoto, K. Imanishi, T. Kikkawa, N. Hara, H. Shigematsu, and K. Joshin, "Degradation-Mode Analysis for Highly Reliable GaN-HEMT", MTT-S 2007, Digest pp. 639
Non Patent Literature 2: F. Yamaki, K. Ishii, M. Nishi, H. Haematsu, Y. Tateno and H. Kawata, "Leakage Current Screening for AlGaN/GaN HEMT Mass-Production", CS MANTECH Conference 2007, Digest pp. 95

FIG. 10 is a diagram for explaining an abnormal growth portion formed on an epitaxial film. In FIG. 10, the upper diagram is a top view, and the lower diagram is a cross-sectional diagram. As shown in FIG. 10, when the GaN film 102 is epitaxially grown on the SiC substrate 101, the abnormal growth portion 103 is formed depending on the growth conditions. The abnormal growth portion 103 has a rounded hexagon shape, and the abnormal growth portion 103 has a diameter of about 40 μm or greater when approximated to a circle, depending on the growth conditions though. The thickness of the abnormal growth portion 103 is about 50 to 100 nm from the surface of the GaN film 102. Under the same growth conditions for the GaN film 102, an abnormal growth portion having almost the same size is formed on one wafer and on wafers that are processed in different batches.

When the gate of an FET is formed on the abnormal growth portion at the time of forming an FET, an increase in gate leakage and pinch-off failure is generated (see Non Patent Literatures 1 and 2). On the other hand, when the gate of an FET is not formed on the abnormal growth portion, there are no abnormalities confirmed such as an increase in gate leakage and pinch-off failure that are caused by the abnormal growth portion. Here, even when a source electrode and a drain electrode are formed on the abnormal growth portion, there will be no abnormalities in electrical characteristics such as DC characteristics. However, the source electrode and the drain electrode, which are ohmic contacts, formed on the abnormal growth portion could influence long-time reliability. It is therefore necessary to prevent an abnormal growth portion from existing in an operating region of an FET. For this reason, it is necessary to remove an FET including an abnormal growth portion in an operating region by an appearance check, for example.

FIG. 11 is a diagram for explaining an issue of the present invention and is a top view showing an FET including gate electrodes 103_1 to 103_4, source electrodes 104_1 to 104_3, and drain electrodes 105_1 to 105_2. In the FET shown in FIG. 11, one unit FET is composed of one gate electrode 103_1, and the source electrode 104_1 and the drain electrode 105_1 that are disposed to sandwich the gate electrode 103_1. A plurality of the unit FETs are arranged in parallel. Here, a region operating as an FET is referred to as an operating region 106. Regions other than the operating region 106 are processed such that semiconductor crystals are destroyed by ion implantation and the like to prevent current from flowing.

In the FET shown in FIG. 11, the drain electrode 105_1, which is positioned between the adjacent gate electrodes 103_1 and 103_2, and the source electrode 104_2, which is positioned between the adjacent gate electrodes 103_2 and 103_3, are formed of a continuous electrode film. In this case, even when an abnormal growth portion 109 is present under the region where the drain electrode 105_2 is formed, the abnormal growth portion 109 is hidden by the drain electrode 105_2, thereby not enabling detection of existence of the abnormal growth portion from appearance. Accordingly, there has been an issue that an FET including an abnormal growth portion in the operating region 106 cannot be removed by an appearance check.

Solution to Problem

A semiconductor apparatus according to the present invention includes: a substrate; an epitaxial layer that is formed on the substrate; and a gate electrode, a source electrode, and a drain electrode that are formed on the epitaxial layer. The source electrode and the drain electrode each include at least two first divided electrodes that are formed to extend in parallel to each other in a first direction, an inter-electrode distance between the first divided electrodes is greater than or equal to a radius of an abnormal growth portion formed on a surface of the epitaxial layer, and widths of the first divided electrodes are less than or equal to the radius of the abnormal growth portion.

In the semiconductor apparatus according to the present invention, the inter-electrode distance between the first divided electrodes is greater than or equal to the radius of the abnormal growth portion formed on the surface of the epitaxial layer. Therefore, the abnormal growth portion is exposed to outside at a gap between the divided electrodes that constitute the source electrode and the drain electrode. This enables easy detection of the abnormal growth portion by an appearance check, thereby easily removing a semiconductor apparatus including an abnormal growth portion in an operating region.

A method for making a semiconductor apparatus according to the present invention includes; forming an epitaxial layer on a substrate; and forming each of a gate electrode, a source electrode, and a drain electrode on the epitaxial layer. In the forming of the gate electrode, the source electrode, and the drain electrode, at least two first divided electrodes that extend in parallel to each other in a first direction are formed for each of the source electrode and the drain electrode, an inter-electrode distance between the first divided electrodes is greater than or equal to a radius of an abnormal growth portion formed on a surface of the epitaxial layer, and widths of the respective first divided electrodes are less than or equal to the radius of the abnormal growth portion.

In the method for making the semiconductor apparatus according to the present invention, the inter-electrode distance between the first divided electrodes is greater than or equal to the radius of the abnormal growth portion formed on the surface of the epitaxial layer. Therefore, the abnormal growth portion is exposed to outside at a gap between the divided electrodes that constitute the source electrode and the drain electrode. This enables easy detection of the abnormal growth portion by an appearance check, thereby easily removing a semiconductor apparatus including an abnormal growth portion in an operating region.

Advantageous Effects of Invention

According to the present invention, it is possible to provide a semiconductor apparatus and a method for making the semiconductor apparatus that are capable of easily removing, by an appearance check, a semiconductor apparatus including an abnormal growth portion in an operating region.

DESCRIPTION OF EMBODIMENTS

First Embodiment

Figure 1A:
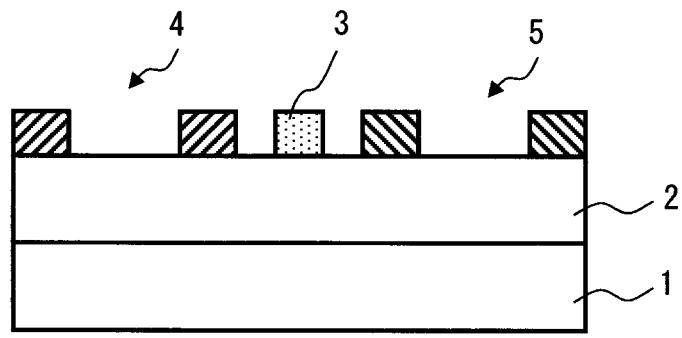
FIG. 1A is a cross-sectional diagram showing a semiconductor apparatus according to a first embodiment.
Figure 1B:
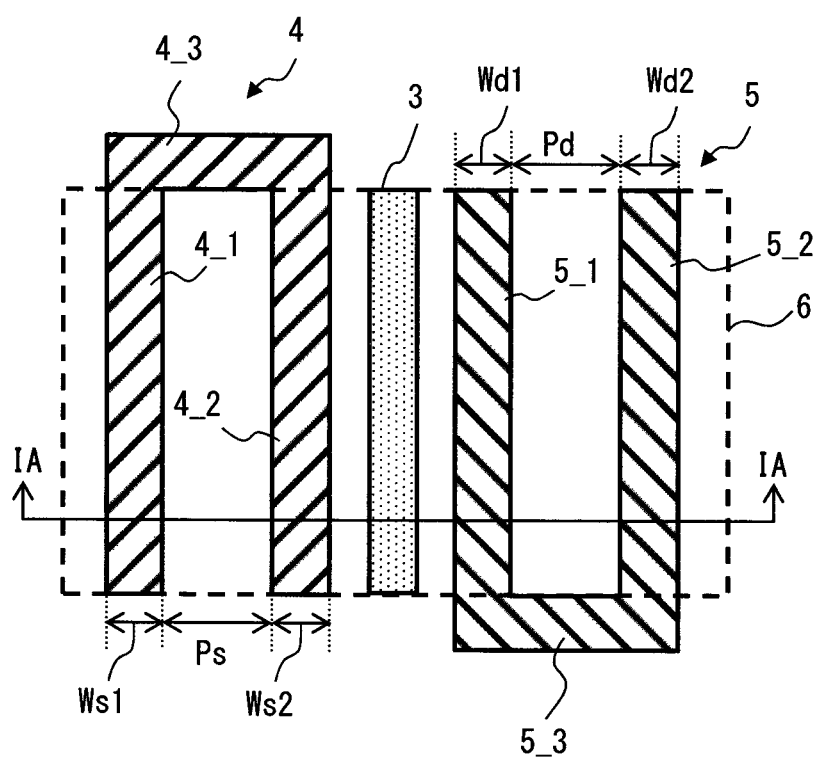
FIG. 1B is a top view showing an arrangement of a gate electrode, a source electrode, and a drain electrode of the semiconductor apparatus according to the first embodiment.

Hereinafter, embodiments of the present invention are explained with reference to the drawings. FIGS. 1A and 1B are diagrams for explaining a semiconductor apparatus according to a first embodiment of the present invention. FIG. 1A is a cross-sectional diagram taken along the line IA-IA of FIG. 1B. FIG. 1B is a top view showing an arrangement of agate electrode, a source electrode, and a drain electrode of the semiconductor apparatus according to this embodiment.

As shown in FIG. 1A, the semiconductor apparatus according to this embodiment includes a substrate 1, an epitaxial layer 2 that is formed on the substrate 1, a gate electrode 3, a source electrode 4, and a drain electrode 5 that are formed on the epitaxial layer 2. The semiconductor apparatus according to this embodiment is an Field Effect Transistor (FET), for example.

When the epitaxial layer 2 is made from a GaN based material, an SiC substrate, a sapphire substrate, an Si substrate, a GaN substrate, a GaAs substrate and the like can be used for the substrate 1. Note that the substrate in this specification indicates a single crystal substrate. The substrate 1 can be determined according to the epitaxial layer 2 formed on the substrate 1. A case is explained below in which an SiC substrate is used for the substrate 1 and GaN is formed as the epitaxial layer 2. However, any combination of materials can be used as a material of the substrate 1 and the epitaxial layer 2 as long as the epitaxial layer 2 can be formed on the substrate 1 and an abnormal growth portion is formed on the surface of the epitaxial layer.

Figure 10:
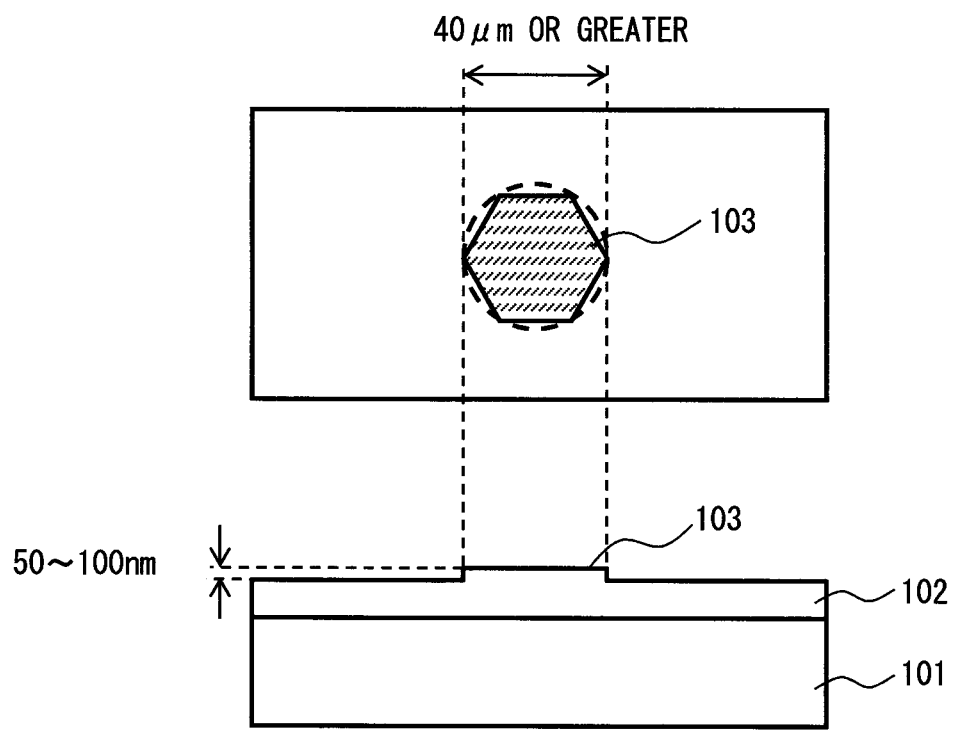
FIG. 10 is a diagram explaining an abnormal growth portion formed on an epitaxial film.

Here, an abnormal growth portion is an abnormal growth portion formed depending on growth conditions when the epitaxial layer 2 is grown on the substrate 1, for example. The abnormal growth portion 103 has a rounded hexagon shape, and the abnormal growth portion 103 has a diameter of about 40 μm or greater when approximated to a circle, depending on the growth conditions though. The thickness of the abnormal growth portion 103 is about 50 to 100 nm from the surface of the GaN film 102 (see FIG. 10). Note that a radius and a diameter of the abnormal growth portion in this specification indicate a radius and a diameter of a circle to which the hexagon abnormal growth portion is approximated. Moreover, under the same growth conditions for the epitaxial layer 2, an abnormal growth portions having almost the same size are formed on one wafer and on wafers that are processed in different batches.

Possible causes of forming the abnormal growth portion 103 are a defect (micropipe) in the substrate 1 where the epitaxial layer 2 is grown and abnormal growth around a minute dust adhered during the growth. The abnormal growth portion could be formed on a GaN film that is epitaxially grown on an Si substrate and a sapphire substrate and on an SiC film that is epitaxially grown on an SiC substrate. Note that the above-mentioned size of the abnormal growth portion is an example, and the present invention can be used to an abnormal growth portion of the size other than the one mentioned above.

The source electrode 4 and the drain electrode 5 are formed to sandwich the gate electrode 3. As shown in FIG. 1B, the source electrode 4 includes divided electrodes (first divided electrodes) 4_1 and 4_2 that extend in parallel to the longitudinal direction of the gate electrode (a first direction) and a connecting electrode 4_3 that connects the divided electrodes 4_1 and 4_2. Here, a pitch between the divided electrode 4_1 and the divided electrode 4_2 shall be referred to as Ps, a width of the divided electrode 4_1 shall be referred to as Ws1, and a width of the divided electrode 4_2 shall be referred to as Ws2.

The drain electrode 5 includes divided electrodes (first divided electrodes) 5_1 and 5_2 that extend in parallel to the longitudinal direction of the gate electrode and a connecting electrode 5_3 that connects the divided electrodes 5_1 and 5_2. Here, a pitch between the divided electrode 5_1 and the divided electrode 5_2 shall be referred to as Pd, a width of the divided electrode 5_1 shall be referred to as Wd1, and a width of the divided electrode 5_2 shall be referred to as Wd2. Further, as shown in FIG. 1B, a region operating as an FET is referred to as an operating region 6. Regions other than the operating region 6 are processed such that semiconductor crystals are destroyed by ion implantation and the like to prevent current from flowing.

In the semiconductor apparatus according to this embodiment, the inter-electrode distance Ps between the divided electrodes 4_1 and 4_2 of the source electrode 4 is greater than or equal to a radius of an abnormal growth portion formed on the surface of the epitaxial layer 2, and widths Ws1 and Ws2 of the respective divided electrodes 4_1 and 4_2 are less than or equal to the radius of the abnormal growth portion. Moreover, the inter-electrode distance Pd between the divided electrodes 5_1 and 5_2 of the drain electrode is greater than or equal to the radius of the abnormal growth portion formed on the surface of the epitaxial layer 2, and the widths Wd1 and Wd2 of the respective divided electrodes 5_1 and 5_2 are less than or equal to the radius of the abnormal growth portion. Then, in this embodiment, it is possible to easily remove, by an appearance check, a semiconductor apparatus including an abnormal growth portion in an operating region.

Figure 11:
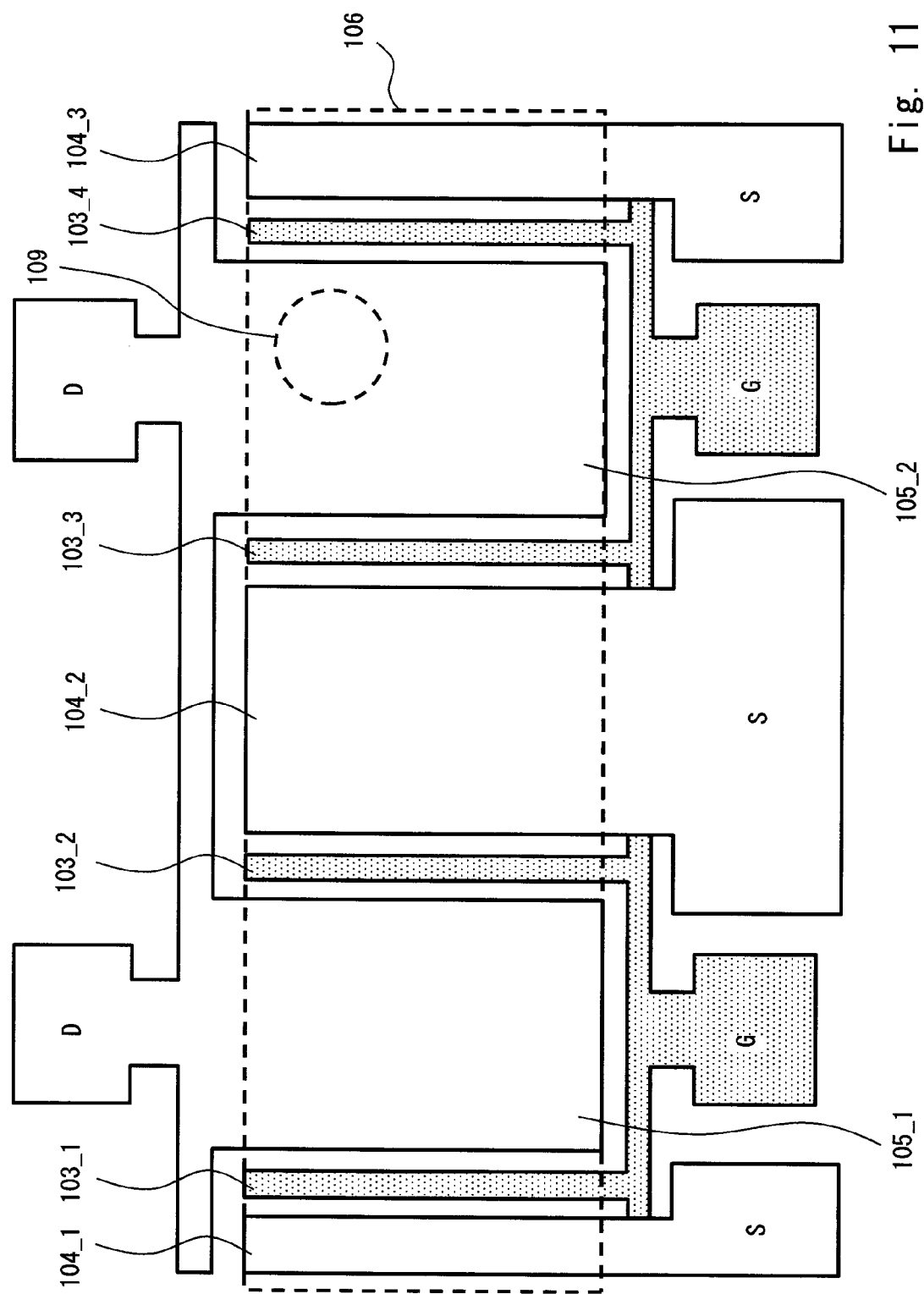
FIG. 11 is a diagram for explaining an issue of the present invention.

That is, in the FET shown in FIG. 11, the drain electrode 105_1, which is positioned between the adjacent gate electrodes 103_1 and 103_2, and the source electrode 104_2, which is positioned between the adjacent gate electrodes 103_2 and 103_3, are formed of a continuous electrode film. In this case, even when an abnormal growth portion 109 is present under the region where the drain electrode 105_2 is formed, the abnormal growth portion 109 is hidden by the drain electrode 105_2, thereby not enabling detection of existence of the abnormal growth portion from appearance. That is, an appearance check of the abnormal growth portion 109 recognizes and detects the contrast of a circumference line of the abnormal growth portion 109. However, the abnormal growth portion 109 is a 50 to 100 nm GaN layer formed to protrude, thus when covered with a thick source electrode or drain electrode, the contrast will be unclear. Hence, there has been a problem that an FET including an abnormal growth portion in an operating region cannot be removed by an appearance check.

Figure 2A:
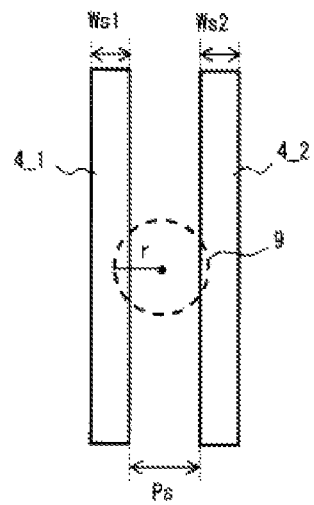
FIG. 2A is a diagram showing an exemplary advantage of the semiconductor apparatus according to the first embodiment.

To that end, in the semiconductor apparatus according to this embodiment, the inter-electrode distance Ps between the divided electrodes 4_1 and 4_2 of the source electrode 4 is greater than or equal to a radius of an abnormal growth portion formed on the surface of the epitaxial layer 2. Further, the inter-electrode distance Pd between the divided electrodes 5_1 and 5_2 of the drain electrode 5 is greater than or equal to the radius of the abnormal growth portion formed on the surface of the epitaxial layer 2. Then, as shown in FIG. 2A, when an abnormal growth portion 9 having a radius r is formed between the divided electrode 4_1 and the divided electrode 4_2 of the source electrode 4, in the invention according to this embodiment, the inter-electrode distance Ps between the divided electrode 4_1 and the divided electrode 4_2 is sufficiently large. Thus, a part of the abnormal growth portion 9 is exposed to outside, enabling easy detection of the abnormal growth portion 9 by an appearance check.

Figure 2B:
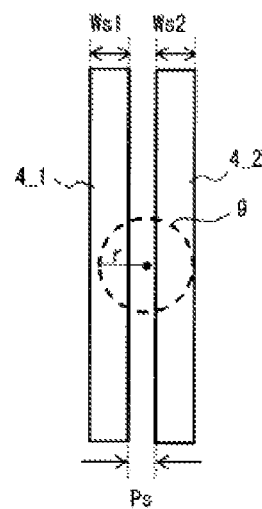
FIG. 2B is a diagram showing an exemplary advantage of the semiconductor apparatus according to a comparative example.

Meanwhile, as shown in a comparative example of FIG. 2B, even with the divided electrodes 4_1 and 4_2 that are provided, when the inter-electrode distance Ps is small, a part of the epitaxial layer exposed to outside will be smaller, making it difficult to check existence of an abnormal growth portion from appearance. Therefore, in the invention according to this embodiment, the inter-electrode distance Ps between the divided electrode 4_1 and the divided electrode 4_2 is greater than or equal to a radius of an abnormal growth portion. This enables easy detection of the abnormal growth portion by an appearance check. FIGS. 2A and 2B illustrate the source electrode, however this applies to the drain electrode as well.

Figure 3A:
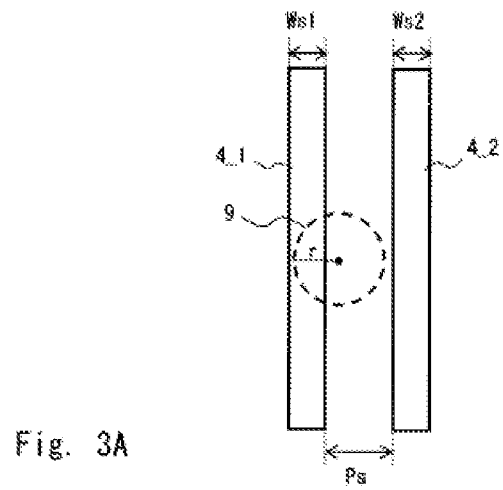
FIG. 3A is a diagram showing an exemplary advantage of the semiconductor apparatus according to the first embodiment.

In addition to the above-mentioned conditions, in the semiconductor apparatus according to this embodiment, the widths Ws1 and Ws2 of the respective divided electrodes 4_1 and 4_2 are less than or equal to a radius of an abnormal growth portion, and the widths Wd1 and Wd2 of the divided electrodes 5_1 and 5_2 are less than or equal to the radius of the abnormal growth portion. Accordingly, as shown in FIG. 3A, when the abnormal growth portion 9 having a radius r is formed to overlap the divided electrode 4_1 of the source electrode 4, the width Ws of the divided electrode 4_1 is small and a part of the abnormal growth portion 9 is exposed to outside, enabling easy detection of the abnormal growth portion 9 by an appearance check.

Figure 3B:
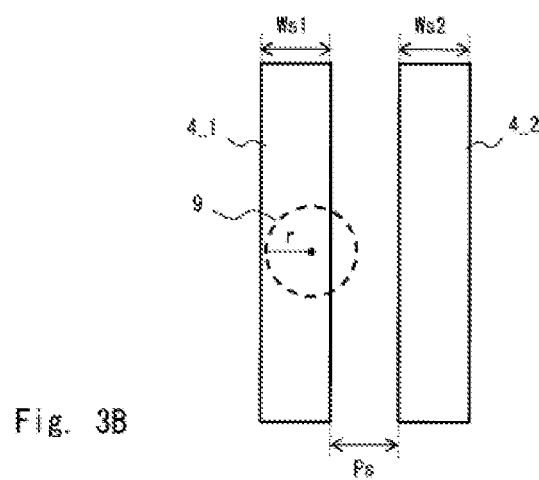
FIG. 3B is a diagram showing an exemplary advantage of the semiconductor apparatus according to a comparative example.

Meanwhile, as shown in a comparative example of FIG. 3B, with the wide width Ws1 of the divided electrode 4_1 of the source electrode 4, when the abnormal growth portion 9 having a radius r is formed to overlap the divided electrode 4_1, a part of the abnormal growth portion 9 exposed to outside will be small, making it difficult to check existence of the abnormal growth portion from appearance. Therefore, as in the invention according to this embodiment, the widths Ws1 and Ws2 of the respective divided electrodes 4_1 and 4_2 are less than or equal to a radius of an abnormal growth portion. This enables easy detection of the abnormal detection portion by an appearance check. FIGS. 3A and 3B illustrate the source electrode, however this applies to the drain electrode as well.

Note that Patent Literature 1 explained in Background Art discloses a technique relating to a high power transistor that is capable of reducing drain-to-source capacitance by dividing a drain electrode into two. However, in the technique disclosed in Patent Literature 1, when a pitch between two drain electrodes is small, it is difficult to check existence of an abnormal growth portion from appearance. Patent Literature 2 discloses a technique in which drain electrodes and source electrodes are formed in lattice to reduce parasitic capacitance in the drain electrodes and the source electrodes. However, in the technique disclosed in Patent Literature 2, when a pitch of the lattice is small, it is difficult to check existence of an abnormal growth portion from appearance.

Figure 4:
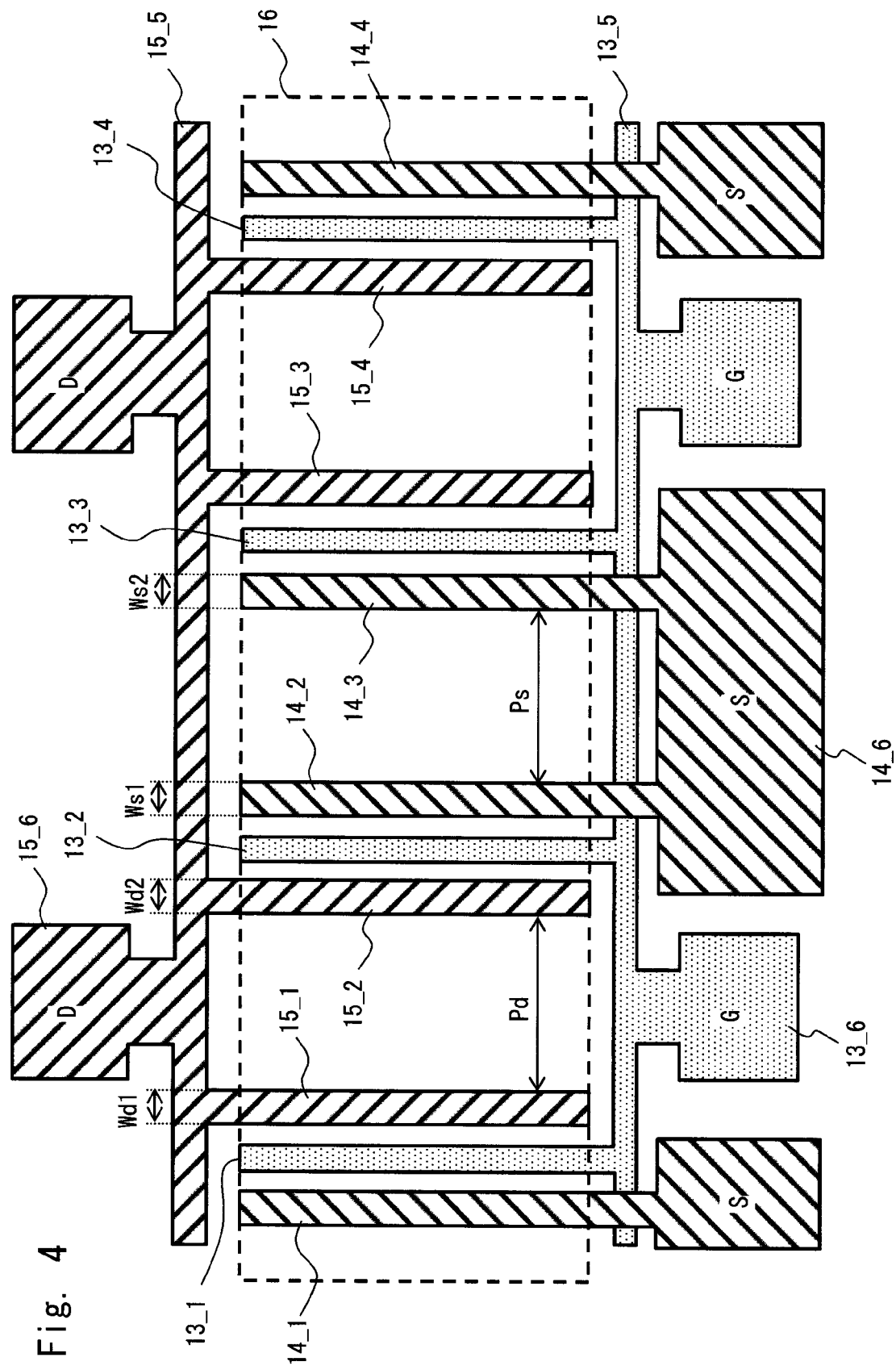
FIG. 4 is a top view showing another arrangement of gate electrodes, source electrodes, and drain electrodes of the semiconductor apparatus according to the first embodiment.

Next, other aspect of the semiconductor apparatus according to this embodiment is explained. FIG. 4 is a top view showing another arrangement of gate electrodes, source electrodes, and drain electrodes of the semiconductor apparatus according to this embodiment. In an FET shown in FIG. 4, one unit FET is composed of one gate electrode 13_1, and the source electrode 14_1 and the drain electrode 15_1 that are disposed to sandwich the gate electrode 13_1. A plurality of the unit FETs are arranged in parallel. Moreover, a region operating as an FET is referred to as an operating region 16. Regions other than the operating region 16 are processed such that semiconductor crystals are destroyed by ion implantation and the like to prevent current from flowing.

The gate electrode includes electrodes 13_1, 13_2, 13_3, and 13_4, a connecting electrode 13_5 that connects these electrodes, and an electrode pad 13_6. Moreover, the source electrode includes divided electrodes 14_1, 14_2, 14_3, and 14_4, and an electrode pad 14_6. The drain electrode includes divided electrodes 15_1, 15_2, 15_3, and 15_4, a connecting electrode 15_5 that connects these divided electrodes, and an electrode pad 15_6.

In the semiconductor apparatus shown in FIG. 4, an inter-electrode distance Ps between the divided electrodes 14_2 and 14_3 of the source electrode is greater than or equal to a radius of an abnormal growth portion formed on a surface of an epitaxial layer, and widths Ws1 and Ws2 of the respective divided electrodes 14_2 and 14_3 are less than or equal to the radius of the abnormal growth portion. Moreover, an inter-electrode distance Pd between the divided electrodes 15_1 and 15_2 of the drain electrode is greater than or equal to the radius of the abnormal growth portion formed on the surface of the epitaxial layer, and widths Wd1 and Wd2 of the respective divided electrodes 15_1 and 15_2 are less than or equal to the radius of the abnormal growth portion. These conditions are the same for other unit FET. Note that a pitch between the divided electrodes and widths of the divided electrodes may be arbitrarily specified for each divided electrode as long as the above-mentioned conditions are satisfied.

For example, when a radius of an abnormal growth portion is 20 μm, the inter-electrode distance Ps between the divided electrodes 14_2 and 14_3 of the source electrode is 60 μm, the widths Ws1 and Ws2 of the respective divided electrodes 14_2 and 14_3 are 15 μm, the inter-electrode distance Pd between the divided electrodes 15_1 and 15_2 of the drain electrode is 60 μm, the widths Wd1 and Wd2 of the respective divided electrodes 15_1 and 15_2 are 15 μm, a pitch between the gate electrode 13_2 and the divided electrode 15_2 of the drain electrode is 5 μm, and a pitch between the gate electrode 13_2 and the divided electrode 14_2 of the source electrode is 5 μm. This applies to other unit FET.

Also in the semiconductor apparatus shown in FIG. 4, the abnormal growth portion included in the operating region can be easily detected by an appearance check.

Figure 5:
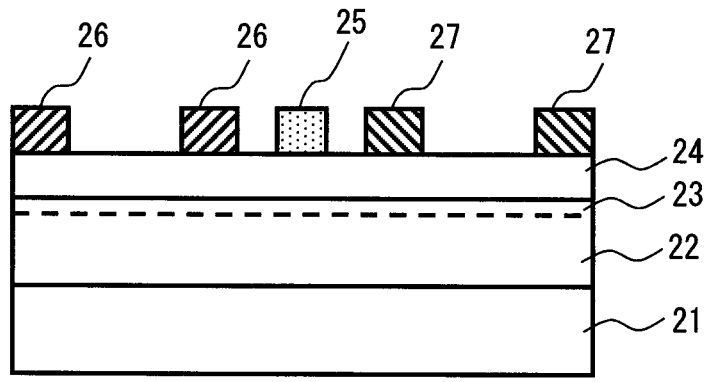
FIG. 5 is cross-sectional diagram showing another example of a semiconductor apparatus according to the first embodiment.

Next, the case is explained in which the invention according to this embodiment is applied to a High Electron Mobility Transistor (HEMT). FIG. 5 is a cross-sectional diagram for explaining an HEMT transistor according to this embodiment.

As shown in FIG. 5, the HEMT transistor according to this embodiment includes a silicon substrate 21, a channel layer 22 formed on the silicon substrate 21, a barrier layer 24 that is formed on the channel layer 22 and supply electrons to the channel layer 22, a two-dimensional electron gas layer (2DEG) 23 formed by heterojunction of the channel layer 22 and the barrier layer 24, a source electrode 26 and a drain electrode 27 that come into ohmic contact with the barrier layer 24, and a gate electrode 25 that is formed between the source electrode 26 and the drain electrode 27 and comes into Schottky contact with the barrier layer 24.

For example, i-GaN (i indicates intrinsic semiconductor not containing impurities) can be used for the channel layer 22. Further, the channel layer 22 may be a multilayer structure containing not only i-GaN but also i-Al(Ga)N, i-In(Ga)N and the like. For example, i-Al$_x$Ga$_{1-x}$N (x=0.1-0.4) or n-AlGaN doped with highly-concentrated Si may be used for the barrier layer 24 formed on the channel layer 22. The barrier layer 24 supplies electrons to the channel layer 22. Then, by heterojunction of the channel layer 22 and the barrier layer 24, the two-dimensional electron gas layer (2DEG) is formed in an interface between the channel layer 22 and the barrier layer 24. The channel layer 22 and the barrier layer 24 are epitaxially grown on the silicon substrate 21. Note that in FIG. 5, a nucleation layer and the like which ease crystal dislocation are not shown.

Further, on the barrier layer 24, the source electrode 26 and the drain electrode 27, which come into ohmic contact with the barrier layer 24, are formed. Electrons flow from the source electrode 26 to the drain electrode 27 via the two-dimensional electron gas layer 23. The source electrode 26 and the drain electrode 27 are composed of an ohmic electrode such as Ti/Al and a wiring electrode such as Ti/Pt/Au. Moreover, the gate electrode 25 that comes into Schottky contact with the barrier layer 24 is formed between the source electrode 26 and the drain electrode 27 on the barrier layer 24. The gate electrode 25 can be formed using Ni/Au, for example.

Next, a method for making the semiconductor apparatus according to this embodiment is explained (see FIGS. 1A and 1B). The method for making the semiconductor apparatus according to this embodiment includes forming the epitaxial layer 2 on the substrate 1 and forming the gate electrode 3, the source electrode 4, and the drain electrode 5 on the epitaxial layer 2. In forming each of the gate electrode 3, the source electrode 4, and the drain electrode 5, at least two divided electrodes 4_1 and 4_2 and at least two divided electrodes 5_1 and 5_2 that extend in parallel to each other in the first direction are formed respectively for the source electrode 4 and the drain electrode 5. Further, the inter-electrode distances Ps and Pd between the divided electrodes are greater than or equal to a radius of an abnormal growth portion formed on the surface of the epitaxial layer 2, and widths of the divided electrodes are less than or equal to the radius of the abnormal growth portion.

As explained above, by the invention according to this embodiment, it is possible to provide a semiconductor apparatus and a method for making the semiconductor apparatus that are capable of, by an appearance check, easily removing a semiconductor apparatus including an abnormal growth portion in an operating region.

Second Embodiment

Next, a second embodiment of the present invention is explained. A difference of this embodiment from the semiconductor apparatus according to the first embodiment is that an arrangement of gate electrodes, source electrodes, and drain electrodes is a lattice pattern. Other configuration is the same as the semiconductor apparatus according to the first embodiment, thus the repeated explanation shall not be provided here.

Figure 6:
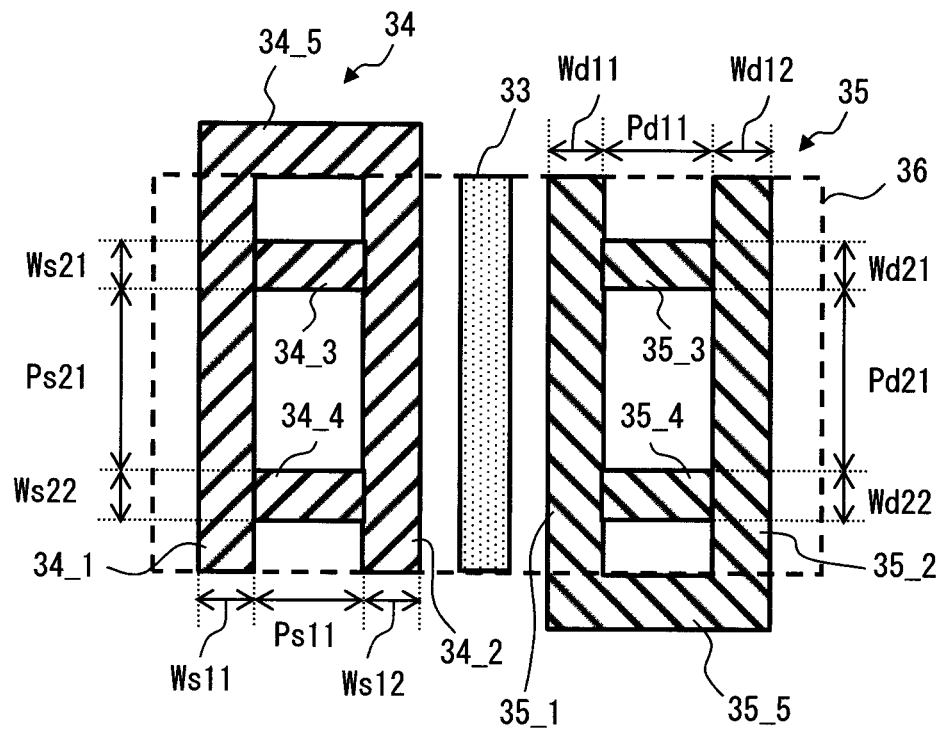
FIG. 6 is a top view showing an arrangement of agate electrode, a source electrode, and a drain electrode of the semiconductor apparatus according to a second embodiment.

FIG. 6 is a top view showing an arrangement of agate electrode, a source electrode, and a drain electrode of the semiconductor apparatus according to the second embodiment. As shown in FIG. 6, a source electrode 34 and a drain electrode 35 are formed to sandwich a gate electrode 33. The source electrode 34 includes divided electrodes 34_1 and 34_2 that extend in parallel to the longitudinal direction of the gate electrode 33 (a first direction), at least two divided electrodes 34_3 and 34_4 (second divided electrodes) that extend toward a direction to cross the divided electrodes 34_1 and 34_2 (a second direction), and a connecting electrode 34_5 that connects the divided electrodes 34_1 and 34_2. Here, a pitch between the divided electrodes 34_1 and 34_2 shall be referred to as Ps11, a width of the divided electrode 34_1 shall be referred to as Ws11, and a width of the divided electrode 34_2 shall be referred to as Ws12. Moreover, a pitch between the divided electrode 34_3 and the divided electrode 34_4 shall be referred to as Ps21, a width of the divided electrode 34_4 shall be referred to as Ws21, and a width of the divided electrode 34_4 shall be referred to as Ws22.

The drain electrode 35 includes divided electrodes 35_1 and 35_2 that extend in parallel to the longitudinal direction of the gate electrode 33, at least two divided electrodes 35_3 and 35_4 (second divided electrodes) that extend toward a direction to cross the divided electrodes 35_1 and 35_2 (a second direction), and a connecting electrode 35_5 that connects the divided electrodes 35_1 and 35_2. Here, a pitch between the divided electrodes 35_1 and 35_2 shall be referred to as Pd11, a width of the divided electrode 35_1 shall be referred to as Wd11, and a width of the divided electrode 35_2 shall be referred to as Wd12. Further, a pitch between divided electrode 35_3 and 35_4 shall be referred to as Pd21, a width of the divided electrode 35_3 shall be referred to as Wd21, and a width of the divided electrode 35_4 shall be referred to as Wd22. Note that FIG. 6 illustrates the case in which the first direction is orthogonal to the second direction, however the first direction and the second direction may only cross each other and not limited to being orthogonal to each other.

As described above, in the semiconductor apparatus according to this embodiment, the source electrode 34 and the drain electrode 35 are formed in lattice. Then, the inter-electrode distance Ps11 between the divided electrodes 34_1 and 34_2 of the source electrode 34 is greater than or equal to a radius of an abnormal growth portion formed on a surface of an epitaxial layer, and widths Ws11 and Ws12 of the respective divided electrodes 34_1 and 34_2 are less than or equal to the radius of the abnormal growth portion. Moreover, the inter-electrode distance Ps21 between the divided electrodes 34_3 and 34_4 of the source electrode 34 is greater than or equal to the radius of the abnormal growth portion formed on the surface of the epitaxial layer, and the widths Ws21 and Ws22 of the respective divided electrodes 34_3 and 34_4 are less than or equal to the radius of the abnormal growth portion. Furthermore, at least one of the inter-electrode distance Ps11 between the divided electrodes 34_1 and 34_2 and the inter-electrode distance Ps21 between the divided electrodes 34_3 and 34_4 is greater than or equal to a diameter of the abnormal growth portion.

In addition, the inter-electrode distance Pd11 between the divided electrodes 35_1 and 35_2 of the drain electrode 35 is greater than or equal to the radius of the abnormal growth portion formed on the surface of the epitaxial layer, and the widths Wd11 and Wd12 of the respective divided electrodes 35_1 and 35_2 are less than or equal to the radius of the abnormal growth portion. Further, the inter-electrode distance Pd21 between the divided electrodes 35_3 and 35_4 of the drain electrode 35 is greater than or equal to the radius of the abnormal growth portion formed on the surface of the epitaxial layer, and the widths Wd21 and Wd22 of the respective divided electrodes 35_3 and 35_4 are less than or equal to the radius of the abnormal growth portion. Furthermore, at least one of the inter-electrode distance Pd11 between the divided electrodes 35_1 and 35_2 and the inter-electrode distance Pd21 between the divided electrodes 35_3 and 35_4 is greater than or equal to a diameter of the abnormal growth portion.

Figure 7:
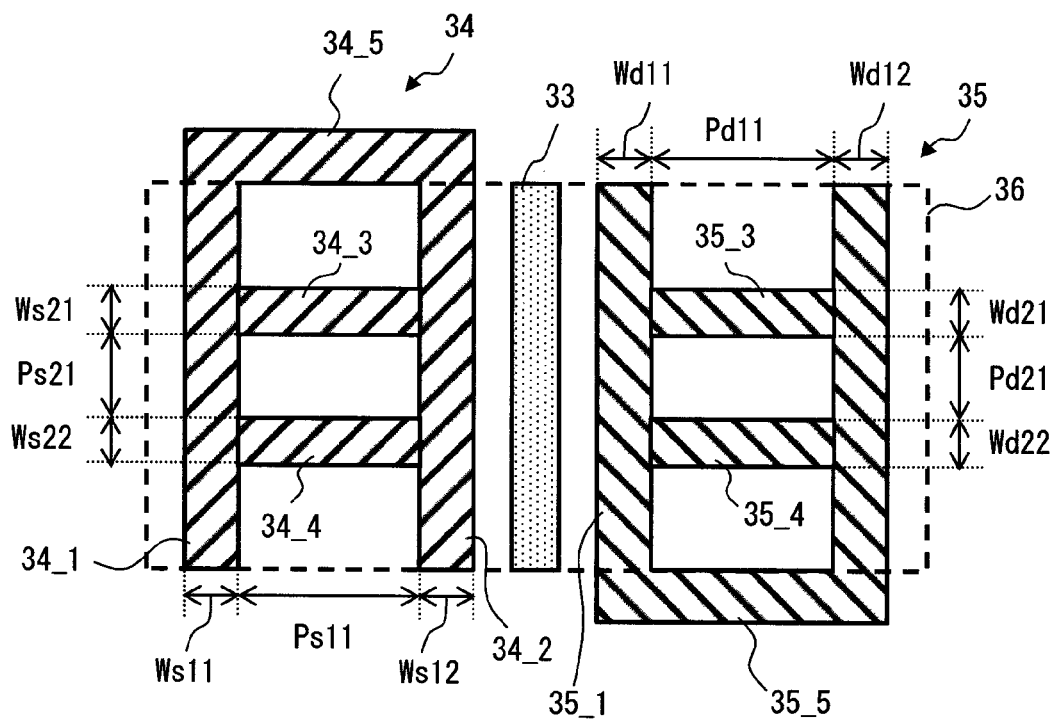
FIG. 7 is a top view showing an arrangement of the gate electrode, the source electrode, and the drain electrode of the semiconductor apparatus according to the second embodiment.

The semiconductor apparatus shown in FIG. 6 is the case in which the inter-electrode distances Ps21 and Pd21 of the divided electrodes that are parallel to the second direction are greater than or equal to the diameter of the abnormal growth portion. Meanwhile, the semiconductor apparatus shown in FIG. 7 is the case in which the inter-electrode distances Ps11 and Pd11 of the divided electrodes that are parallel to the first direction are greater than or equal to the diameter of an abnormal growth portion.

Figure 8A:
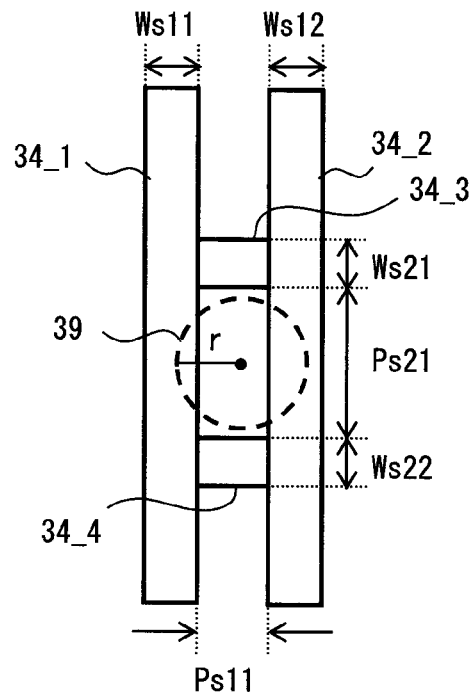
FIG. 8A is a diagram showing an exemplary advantage of the semiconductor apparatus according to the first embodiment.

In the semiconductor apparatus according to this embodiment, the source electrodes and the drain electrodes are formed to satisfy the above-mentioned conditions. This exposes apart of an abnormal growth portion 39 having a radius r to outside, as shown in FIG. 8A for example, and enables easy detection of the abnormal growth portion 39 by an appearance check. Here, FIG. 8A shows the case in which the inter-electrode Ps11 between the divided electrodes 34_1 and 34_2 is greater than or equal to a radius of an abnormal growth portion, and the inter-electrode Ps21 between the divided electrodes 34_3 and 34_3 is greater than or equal to a diameter of the abnormal growth portion.

Figure 8B:
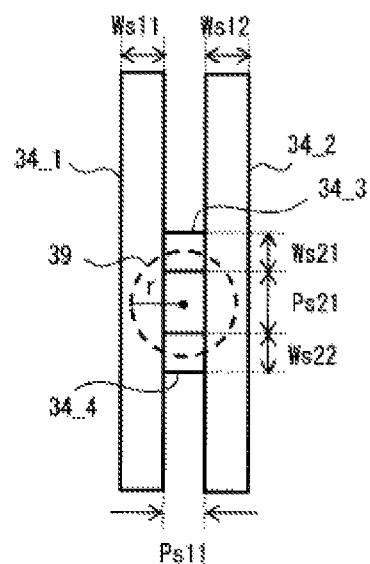
FIG. 8B is a diagram showing an exemplary advantage of the semiconductor apparatus according to a comparative example.

On the other hand, as shown in a comparative example of FIG. 8B, in the case of not satisfying the condition in which at least one of the inter-electrode distance Ps11 between the divided electrodes 34_1 and 34_2 and the inter-electrode distance Ps21 between the divided electrodes 34_3 and 34_4 is greater than or equal to the radius of the abnormal growth portion, the abnormal growth portion 39 will be covered with the divided electrode, thereby not enabling detection of the abnormal growth portion 39 by an appearance check. Here, FIGS. 8A and 8B show the source electrode, however this applies to the drain electrode as well.

Figure 9:
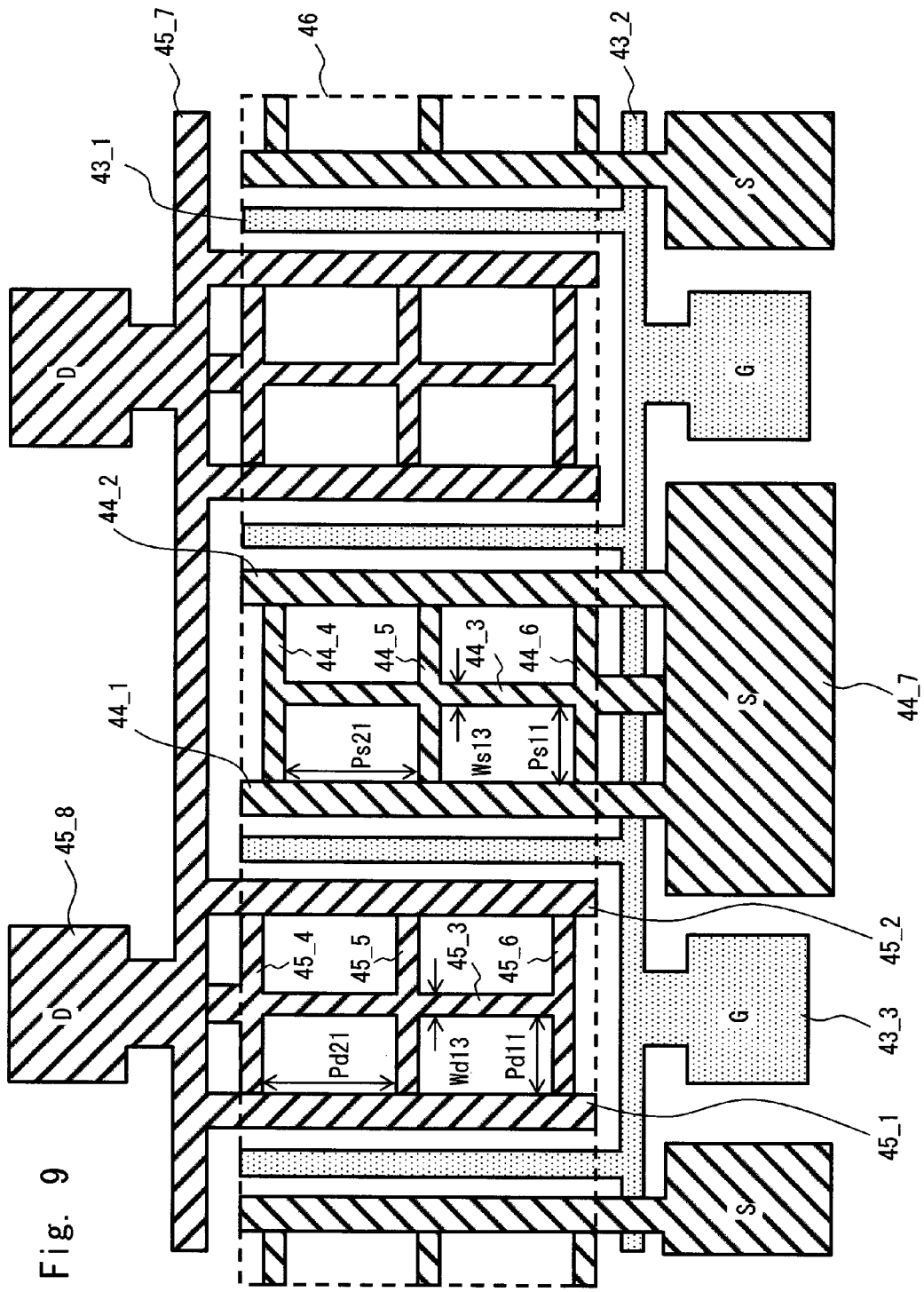
FIG. 9 is a top view showing another arrangement of gate electrodes, source electrodes, and drain electrodes of the semiconductor apparatus according to this embodiment.

Next, other aspect of the semiconductor apparatus according to this embodiment is explained. FIG. 9 is a top view showing another arrangement of gate electrodes, source electrodes, and drain electrodes of the semiconductor apparatus according to this embodiment. In an FET shown in FIG. 9, one unit FET is composed of one gate electrode, and a gate electrode and a drain electrode formed to sandwich the gate electrode. A plurality of the unit FET are arranged in parallel. Moreover, a region operating as an FET is referred to as an operating region 46. Regions other than the operating region 46 are processed such that semiconductor crystals are destroyed by ion implantation and the like to prevent current from flowing.

The gate electrode includes a plurality of electrodes 43_1, a connecting electrode 43_2 that connects these electrodes, and an electrode pad 43_3. Further, the source electrode includes divided electrodes 44_1, 44_2, 44_3, the divided electrodes 44_4, 44_5 and 44_6 that are orthogonal to the divided electrodes 44_1, 44_2 and 44_3, and an electrode pad 44_7. The drain electrode includes divided electrodes 45_1, 45_2, 45_3, the divided electrodes 45_4, 45_5 and 45_6 that are orthogonal to the divided electrodes 45_1, 45_2 and 45_3, a connecting electrode 45_7 that connects the divided electrodes 45_1, 45_2, and 45_3, and an electrode pad 45_8.

Then, the inter-electrode distance Ps11 between the divided electrodes 44_1, 44_2, and 44_3 of the source electrode is greater than or equal to a radius of an abnormal growth portion formed on a surface of an epitaxial layer, and widths of the divided electrodes 44_1, 44_2, and 44_3 are less than or equal to the radius of the abnormal growth portion. Moreover, the inter-electrode distance Ps21 between the divided electrodes 44_4, 44_5, and 44_6 of the source electrode is greater than or equal to the radius of the abnormal growth portion formed on the surface of the epitaxial layer, and widths of the divided electrodes 44_4, 44_5, and 44_6 are less than or equal to the radius of the abnormal growth portion. Furthermore, at least one of the inter-electrode distance Ps11 between the divided electrodes 44_1, 44_2, and 44_3 and the inter-electrode distance Ps21 between the divided electrodes 44_4, 44_5, and 44_6 is greater than or equal to a diameter of the abnormal growth portion. In the example shown in FIG. 9, the inter-electrode distance Ps21 between the divided electrodes 44_4, 44_5, and 44_6 is greater than or equal to the diameter of the abnormal growth portion.

In addition, the inter-electrode distance Pd11 between the divided electrodes 45_1, 45_2, and 45_3 of the drain electrode is greater than or equal to the radius of the abnormal growth portion formed on the surface of the epitaxial layer, and widths of the divided electrodes 45_1, 45_2, and 45_3 are less than or equal to the radius of the abnormal growth portion. Further, the inter-electrode distance Pd21 between the divided electrodes 45_4, 45_5, and 45_6 of the drain electrode is greater than or equal to the radius of the abnormal growth portion formed on the surface of the epitaxial layer, and widths of the divided electrodes 45_1, 45_2, and 45_3 are less than or equal to the radius of the abnormal growth portion. Furthermore, at least one of the inter-electrode distance Pd11 between the divided electrodes 45_1, 45_2, and 45_3 and the inter-electrode distance Pd21 between the divided electrodes 45_4, 45_5, and 45_6 is greater than or equal to a diameter of the abnormal growth portion. In the example shown in FIG. 9, the inter-electrode distance Pd21 between the divided electrodes 45_4, 45_5, and 45_6 is greater than or equal to the diameter of the abnormal growth portion. These conditions are the same for other unit FET.

For example, when a radius of an abnormal growth portion is 20 μm, the inter-electrode distance Ps11 between the divided electrodes 44_1, 44_2, and 44_3 of the source electrode is 25 μm, the inter-electrode distance Ps21 between the divided electrodes 44_4, 44_5, and 44_6 is 45 μm, the widths of the divided electrodes 44_1 and 44_2 are 15 μm, and the widths of the divided electrodes 44_3, 44_4, 44_5, and 44_6 are 10 μm. Additionally, the inter-electrode distance Pd11 between the divided electrodes 45_1, 45_2, and 45_3 of the drain electrode is 25 μm, the inter-electrode distance Pd21 between the divided electrodes 45_4, 45_5, and 45_6 is 45 μm, the widths of the divided electrodes 45_1 and 45_2 are 15 μm, and the widths of the divided electrodes 45_3, 45_4, 45_5, and 45_6 are 10 μm.

Note that a pitch between the divided electrodes and widths of the divided electrodes may be arbitrarily specified for each divided electrode as long as the above-mentioned conditions are satisfied. Moreover, the divided electrodes 44_4, 44_5, and 44_6 of the source electrode are not necessarily orthogonal to the divided electrodes 44_1, 44_2, and 44_3, but may be provided to obliquely cross the divided electrode 44_1, 44_2, and 44_3. Similarly, the divided electrodes 45_4, 45_5, and 45_6 of the drain electrode are not necessarily orthogonal to the divided electrodes 45_1, 45_2, and 45_3, but may be provided to obliquely cross the divided electrode 45_1, 45_2, and 45_3.

Also in the semiconductor apparatus shown in FIG. 9, an abnormal growth portion included in an operating region can be easily detected by an appearance check. Therefore, according to the invention set forth in this embodiment, it is possible to provide a semiconductor apparatus and a method for making the semiconductor apparatus that are capable of easily removing, by an appearance check, a semiconductor apparatus including an abnormal growth portion in an operating region.

Moreover, in the semiconductor apparatus according to the first embodiment, the drain electrode and the source electrodes are divided into a plurality of divided electrodes. Thus, density of current flowing into one divided electrode increases, which possibly degrades the electrodes due to electromigration. However, in the semiconductor apparatus of this embodiment (in particular, a configuration of the semiconductor apparatus shown in FIG. 9), the drain electrodes and the source electrodes are formed in lattice, thereby reducing the density of current flowing into one divided electrode and thus suppressing degradation of the electrodes due to electromigration. Further, phase shift in signals between the divided electrodes can be eliminated. Furthermore, in the semiconductor apparatus according to this embodiment, the source electrodes and the drain electrodes are formed to satisfy the above-mentioned conditions to thereby enable easy removal of a semiconductor apparatus including an abnormal growth portion in an operating region by an appearance check.

Note that the present invention is not limited to this embodiment but can be changed appropriately without departing from the scope. In the first and second embodiment, the inter-electrode distances Ps and Pd, Ps 11 and Pd 11 of the first electrodes are greater than or equal to a radius of an abnormal growth portion, however the inter-electrode distance of the first divided electrodes may be greater than or equal to ¾ of a diameter of the abnormal growth portion, for example. Moreover, in the second embodiment, the inter-electrode distances Ps21 and Pd21 of the second divided electrodes are greater than or equal to a radius of an abnormal growth portion, however, the inter-electrode distance of the second divided electrodes may be greater than or equal to ¾ of a diameter of the abnormal growth portion, for example. In this way, by the inter-electrode distance of the divided electrodes that is greater than or equal to ¾ of the diameter of the abnormal growth portion, it is possible to correctly remove a semiconductor apparatus including an abnormal growth portion in an operating region.

Although the present invention has been explained according to the above-mentioned embodiments, it is not limited to the configuration of the above-mentioned embodiments and various modification, correction, and combination, obvious to those skilled in the art, within the scope of the invention set forth in claims of the present application.

The present application claims priority rights of and is based on Japanese Patent Application No. 2011-096929 filed on Apr. 25, 2011 in the Japanese Patent Office, the entire contents of which are hereby incorporated by reference.

REFERENCE SIGNS LIST

1 SUBSTRATE
2 EPITAXIAL LAYER
3 GATE ELECTRODE
4 SOURCE ELECTRODE
5 DRAIN ELECTRODE
6 OPERATING REGION
4_1, 4_2 DIVIDED ELECTRODE
4_3 CONNECTING ELECTRODE
5_1, 5_2 DIVIDED ELECTRODE
5_3 CONNECTING ELECTRODE
9 ABNORMAL GROWTH PORTION

The invention claimed is:

1. A semiconductor apparatus comprising:
a substrate;
an epitaxial layer that is formed on the substrate; and
a gate electrode, a source electrode, and a drain electrode that are formed on the epitaxial layer,
wherein the source electrode and the drain electrode each include at least two first divided electrodes that are formed to extend in parallel to each other in a first direction, the at least two first divided electrodes of the source electrode being disposed on one side of the gate electrode and the at least two first divided electrodes of the drain electrode being disposed on another side of the gate electrode that is opposite the one side, an inter-electrode distance between the first divided electrodes is greater than or equal to a radius of an abnormal growth portion formed on a surface of the epitaxial layer, and widths of the first divided electrodes are less than or equal to the radius of the abnormal growth portion.

2. The semiconductor apparatus according to claim 1, wherein
the source electrode and the drain electrode each further include at least two second divided electrodes that are formed to extend in parallel to each other in a second direction, the second direction crosses the first divided electrodes, an inter-electrode distance between the second divided electrodes is greater than or equal to the radius of the abnormal growth portion, widths of the second divided electrodes are less than or equal to the radius of the abnormal growth portion, and at least one of the inter-electrode distance between the first divided electrodes and the inter-electrode distance between the second divided electrodes is greater than or equal to a diameter of the abnormal growth portion.

3. The semiconductor apparatus according to claim 2, wherein the inter-electrode distance between the second divided electrodes is greater than or equal to ¾ of the diameter of the abnormal growth portion.

4. The semiconductor apparatus according to claim 2, wherein the abnormal growth portion has a hexagon shape on the surface of the epitaxial layer, and the radius of the abnormal growth portion is a radius of a circle to which the hexagon shape is approximated.

5. The semiconductor apparatus according to claim 2, wherein the epitaxial layer contains GaN.

6. The semiconductor apparatus according to claim 2, wherein the substrate is any one of an SiC substrate, a sapphire substrate, an Si substrate, a GaN substrate, and a GaAs substrate.

7. The semiconductor apparatus according to claim 2, wherein the radius of the abnormal growth portion is 20 μm or greater.

8. The semiconductor apparatus according to claim 1, wherein the abnormal growth portion has a hexagon shape on the surface of the epitaxial layer, and the radius of the abnormal growth portion is a radius of a circle to which the hexagon shape is approximated.

9. The semiconductor apparatus according to claim 8, wherein the epitaxial layer contains GaN.

10. The semiconductor apparatus according to claim 8, wherein the substrate is any one of an SiC substrate, a sapphire substrate, an Si substrate, a GaN substrate, and a GaAs substrate.

11. The semiconductor apparatus according to claim 1, wherein the epitaxial layer contains GaN.

12. The semiconductor apparatus according to claim 1, wherein the substrate is any one of an SiC substrate, a sapphire substrate, an Si substrate, a GaN substrate, and a GaAs substrate.

13. The semiconductor apparatus according to claim 1, wherein the radius of the abnormal growth portion is 20 μm or greater.

14. The semiconductor apparatus according to claim 1, wherein a plurality of electrode sets are arranged in parallel, each of the plurality of electrode sets including the gate electrode, and the source electrode and the drain electrode that sandwich the gate electrode.

15. The semiconductor apparatus according to claim 1, wherein the inter-electrode distance between the first divided electrodes is greater than or equal to ¾ of the diameter of the abnormal growth portion.

16. The semiconductor apparatus according to claim 1, wherein
the epitaxial layer comprises:
a channel layer;
a barrier layer that is formed on the channel layer and supplies electrons to the channel layer; and
a two-dimensional electron gas layer that is formed by heterojunction of the channel layer and the barrier layer,
the source electrode and the drain electrode are formed to come into ohmic contact with the barrier layer, and
the gate electrode is formed to come into Schottky contact with the barrier layer.

17. The semiconductor apparatus according to claim 16, wherein the channel layer is made from i-GaN, and the barrier layer is made from $i-Al_xGa_{1-x}N(x=0.1$ to $0.4)$.

18. A semiconductor apparatus comprising:
a substrate;
an epitaxial layer that is formed on the substrate; and
a gate electrode, a source electrode, and a drain electrode that are formed on the epitaxial layer,
wherein the source electrode and the drain electrode each include at least two first divided electrodes that are formed to extend in parallel to each other in a first direction, the at least two first divided electrodes of the source electrode being disposed on one side of the gate electrode and the at least two first divided electrodes of the drain electrode being disposed on another side of the gate electrode that is opposite the one side, an inter-electrode distance between the first divided electrodes is greater than or equal to a radius of an abnormal growth portion formed on a surface of the epitaxial layer, and widths of the first divided electrodes are less than or equal to the radius of the abnormal growth portion, and the at least two first divided electrodes of the source electrode are disposed in relation to each other without the gate electrode or the drain electrode being disposed between the at least two first divided electrodes of the source electrode, and the at least two first divided electrodes of the drain electrode are disposed in relation to each other without the gate electrode or the source electrode being disposed between the at least two first divided electrodes of the drain electrode.

19. A method for making a semiconductor apparatus comprising:

forming an epitaxial layer on a substrate; and forming each of a gate electrode, a source electrode, and a drain electrode on the epitaxial layer, wherein in the forming of the gate electrode, the source electrode, and the drain electrode, at least two first divided electrodes that extend in parallel to each other in a first direction are formed for each of the source electrode and the drain electrode, the at least two first divided electrodes of the source electrode being formed on one side of the gate electrode and the at least two first divided electrodes of the drain electrode being formed on another side of the gate electrode that is opposite the one side, an inter-electrode distance between the first divided electrodes is greater than or equal to a radius of an abnormal growth portion formed on a surface of the epitaxial layer, and widths of the first divided electrodes are less than or equal to the radius of the abnormal growth portion.

20. The method according to claim 19, wherein at least two second divided electrodes that extend in parallel to each other in a second direction are formed for each of the source electrode and the drain electrode, the second direction crosses the first divided electrodes, an inter-electrode distance between the second divided electrodes is greater than or equal to the radius of the abnormal growth portion, widths of the second divided electrodes are less than or equal to the radius of the abnormal growth portion, and at least one of the inter-electrode distance between the first divided electrodes and the inter-electrode distance between the second divided electrodes is greater than or equal to a diameter of the abnormal growth portion.

* * * * *